(12) United States Patent
Kappeler

(10) Patent No.: US 6,205,161 B1
(45) Date of Patent: Mar. 20, 2001

(54) METHOD AND DEVICE FOR OPERATING A LASER DIODE

(75) Inventor: Franz Kappeler, Puccheim (DE)

(73) Assignee: AGFA-Gevaert Aktiengesellschaft, Leverkusen (DE)

( * ) Notice: Subject to any disclaimer, the term of this patent is extended or adjusted under 35 U.S.C. 154(b) by 0 days.

(21) Appl. No.: 09/125,609

(22) PCT Filed: Feb. 20, 1997

(86) PCT No.: PCT/EP97/00814

§ 371 Date: Aug. 21, 1998

§ 102(e) Date: Aug. 21, 1998

(87) PCT Pub. No.: WO97/32373

PCT Pub. Date: Sep. 4, 1997

(30) Foreign Application Priority Data

Mar. 1, 1996 (DE) .............................................. 196 07 877
Mar. 1, 1996 (DE) .............................................. 196 07 880

(51) Int. Cl.[7] .............................. H01S 3/10; H01S 3/00; H01S 3/08; H01S 3/082

(52) U.S. Cl. ............................. 372/38.1; 372/26; 372/96; 372/97

(58) Field of Search .................................. 372/38, 96, 97, 372/26

(56) References Cited

U.S. PATENT DOCUMENTS

| 4,799,069 | 1/1989 | Sasaki et al. | 346/108 |
|---|---|---|---|
| 4,817,098 | 3/1989 | Horokawa | 372/29 |
| 4,987,426 | 1/1991 | Ota et al. | 346/108 |
| 5,081,631 | * 1/1992 | Dhurjaty | 372/38 |
| 5,177,755 | 1/1993 | Johnson | 372/38 |
| 5,222,070 | 6/1993 | Niki | 372/25 |
| 5,283,793 | 2/1994 | Shoji | 372/24 |
| 5,305,336 | 4/1994 | Adar et al. | 372/18 |
| 5,386,124 | 1/1995 | Yasuda et al. | 250/585 |

FOREIGN PATENT DOCUMENTS

| 3410729 | 9/1985 | (DE) . |
|---|---|---|
| 3442188 | 5/1986 | (DE) . |
| 0084871 | 8/1983 | (EP) . |
| 0308603 | 3/1989 | (EP) . |
| 0568897 | 11/1993 | (EP) . |
| 56077865 | * 6/1981 | (JP) . |

OTHER PUBLICATIONS

Kim et al, Apr. 1, 1995, Optics Letters, Coherence–collapse 1.3 um multimode laser diode for the fiber optic gyroscope, 731–733.*

D. Lenstra et al., "Coherence Collapse in Single–Mode Semiconductor Lasers Due to Optical Feedback", IEEE Journal of Quantum Electronics, vol. QE 21, No. 6, Jun. 1985 pp. 674–679.

Klaus Petermann, "External Optical Feedback Phenomena in Semiconductor Lasers", IEEE Journal of Selected Topics in Quantum Electronics, vol. 1, No. 2, Jun. 1995.

A.J. Lowery, Ph.D., "New Dynamic Multimode Model for External Cavity Semiconductor Lasers", IEE Proceedings, vol. 136, Pt. J, No. 4, Aug. 1989, pp. 229–237.

(List continued on next page.)

Primary Examiner—Frank G. Font
Assistant Examiner—Armando Rodriguez
(74) Attorney, Agent, or Firm—Milde, Hoffberg & Macklin, LLP

(57) ABSTRACT

The invention concerns a method of operating a laser diode (2) producing a beam (9) whose intensity is controlled by a control signal and which is directed along a first beam path (10) at the target surface (5), stray reflections from the target surface (50 which are unstable with respect to the diode (2) in time and/or space acting on the diode (2). An element (19, 28, 31, 37, 38) which is stable in time and with respect to the diode (2) in space is used to feed part of the light emitted by the diode back along a second beam path (11) to the active zone (42) of the diode (2) so that the diode (2) is kept in a state of coherence collapse.

23 Claims, 7 Drawing Sheets

OTHER PUBLICATIONS

J. Wang et al., "Noise Characteristics of PCM–Modulated Single–Mode Semiconductor Laser Diodes with Distant Optical Feedback", IEE Proceedings, vol. 137, Pt. J. No. 6, Dec. 1990, pp. 385–390.

Charles H. Henry et al., "Instability of Semiconductor Lasers Due to Optical Feedback from Distant Reflectors", IEEE Journal of Quantum Electronics, vol. QE–22, No. 2, Feb. 1986.

Roy Lang, et al., "External Optical Feedback Effects on Semiconductor Injection Laser Properties", IEEE Journal of Quantum Electronics, vol. QE–16, No. 3, Mar. 1980.

I.S. Kim, et al., "Coherence–Collapsed1.3–um Multimode Laser Diode for the Fiber–Optic Gyroscope", Optics Letters, 20 (1995) Apr. 1, No. 7, New York, pp. 731–733.

R.W. Tkach, Regimes of Feedback Effects in 1.5 um Distributed Feedback Lasers, Journal of Lightware Technology, LT–4, (Nov. 11, 1986), pp. 1655–1661.

K. Petermann, "Laserdiode Modulation and Noise", Kluwer Academic Publishers, Dordrecht (NL), 1988, pp. 251–290.

K. Petermann, "External Optical Feedback Phenomena in Semiconductor Lasers", IEEE Journal of Selected Topics in Quantum Electronics, 1, (Jun. 2, 1996), pp. 480–489.

* cited by examiner

METHOD AND DEVICE FOR OPERATING A LASER DIODE

CROSS REFERENCE TO RELATED APPLICATION

This application is related in subject matter to the U.S. patent application Ser. No. 08/805,992, filed Feb. 24, 1997 now U.S. Pat. No. 5,946,333 and entitled "METHOD AND CIRCUIT FOR OPERATING A LASER DIODE". The present application and this prior application are commonly assigned.

BACKGROUND OF THE INVENTION

The present invention relates to a method and a device for operating a laser diode, whereby the intensity of the laser beam produced by the diode is adjusted with an adjustment signal and directed along a path to stock, such as printer stock or photographic stock, that is to be illuminated. Under certain conditions unstable reflections from the stock, acting as a reflector, act on the diode with respect to time and/or space, thus interfering with the laser intensity.

Laser diodes are employed in many fields of communications. They are particularly practical because the intensity of the light they emit can be modulated. Since they are so small and easy to control electronically, laser diodes can be employed to transmit data very rapidly. This feature is of significant advantage not only for transmitting but also for reproducing information.

Laser diodes, however, do have one drawback in that they tend to shift spontaneously from one mode to another at specific ranges of intensity. This tendency results in the low-frequency intensity fluctuations called mode hopping. Mode hopping is particularly annoying when laser diodes are employed to switch statically or dynamically, especially for signal modulation.

Several ways to avoid mode hopping have already been suggested. The U.S. Pat. No. 4,817,098 for example proposes a system that involves various means of maintaining laser outputs constant. The temperature of the diode can be measured for instance and regulated to minimize temperature fluctuations and accordingly maintain its output as constant as possible.

The U.S. Pat. No. 5,283,793 suggests superposing a high-frequency signal over an imaging signal being applied to printer stock.

US Pat. Nos. 4,799,069 and 5,386,124, finally, suggest preventing mode hopping by briefly turning the laser diode off between every pair of pixel signals.

These approaches to the prevention of mode hopping are either technically rather complicated or lead to relatively unsatisfactory results. One object of the present invention is accordingly a method and device for preventing the sudden low-frequency disruptions in laser intensity that mode hopping causes. A more specific object is to stabilize the light emitted by a laser diode scanning a surface with respect to mode hopping when reflections from the surface interfere with the diode.

These objects, as well as other objects which will become apparent from the discussion that follows, are achieved, in accordance with the present invention, by producing intentional and controlled feedback of enough of the light emitted by the laser diode back to the diode's effective surface, via another path, to maintain the laser diode in a state of coherence collapse.

SUMMARY OF THE INVENTION

The present invention is based on the awareness that mode hopping can be prevented by establishing as many different modes as possible inside the laser diode. This approach generates high-frequency noise and suppresses the low-frequency noise generated by mode hopping.

The light emitted from the laser diode is fed back to its effective surface by way of an optical component that is stable with respect to time, and, in terms of the diode, with respect to space, maintaining the diode in a state of coherence collapse. A little of the emitted light is accordingly reflected by an external mirror and hence to the laser resonator by appropriate optical components. The light is fed back over a different path that can be at least partly separate from the utility path. The diode's light-emitting area constitutes, in conjunction with the light-feedback component, an external resonator that is considerably longer than the diode's resonator alone. The resonance frequencies (equivalent to modes) of the external resonator are accordingly much closer together than those of the laser resonator itself. The mode intervals can for example be 500 MHz for an external resonator 30 cm long and 170 GHz for a GaAlAs laser diode 0.2 mm long.

The light fed back to the laser diode over the utility path will always exhibit slight fluctuations in amplitude and phase provoked not only by optical noise (spontaneous emission) from the diode itself but also by time-variant optical reflections from the various moving components (pivoting mirrors and film).

Once the output of the light being intentionally fed back over the second path exceeds a prescribed minimum, the fluctuations in amplitude and phase at the effective surface will be amplified to the point of static inherent modulation in the light output (AM) and in the laser frequency (FM). The period T of this inherent modulation will be dictated by the time $2 \cdot L_{extern}/c$ the lightwave takes to travel in the additional external resonator, whereby $L_{extern}$ is the length of the external resonator and c the speed of light ($3 \cdot 10^{10}$ cm/sec). The reciprocal of period T, however, is precisely the frequency interval $$df = 1/T = c/(2 \cdot L_{extern})$$

of the external resonator's modes.

The combined AM and FM inherent modulation generates a large number of sidebands, that coincide precisely with the external resonator's modes. A large number of external-resonator modes can accordingly be simultaneously established in a laser system comprising a laser diode and an external resonator, and the emitted laser energy can be uniformly distributed over a large number of modes and maintained constant in the time-based means.

One effect that can be intentionally achieved and maintained time-constant in accordance with the present invention is that the large number of modes will considerably decrease the coherence length of the resulting radiation. This state of the laser diode is called coherence collapse because the radiation will convert abruptly from a state of higher coherence (monomodal operation with static mode hopping) to one of lower coherence (multimodal operation without mode hopping) once the beam has exceeded a critical threshold in the fed-back light output.

In systems intended to stabilize the frequency of the laser beam, the optical coupling is intended to ensure that the optical path is at least as short as the light's coherence. Systems of this type are described in German Patents Nos. 3,442,188 A1 and 3,410,729 A1 l for example. Feeding the light back in the system in accordance with the present invention, which exploits coherence collapse, is intended on the other hand to ensure that the path of the fed-back light is actually longer than the coherence, and the feedback in such a system is accordingly called incoherent.

How much optical-feedback output is need to achieve coherence collapse, depends on the type of laser diode and on how much light the external resonator can reflect. It is on the order of a small percentage of the emitted output. R. W. Tkach, Regimes of Feedback Effects in 1.5 □μm Distributed Feedback Lasers, *Journal of Lightware Technology*, LT-4, 11 (November 1986), 1655–61 and K. Petermann, "Laserdiode Modulation and Noise", Kluwer Academic Publishers, Dordrecht (NL), 1988, 251–90 describe studies of laser diodes operating subject to coherence collapse and discuss appropriate levels of reflection. K. Petermann, External Optical Feedback Phenomena in Semiconductor Lasers, *IEEE Journal of Selected Topics in Quantum Electronics*, 1, 2 (June 1996) 480–89, describes further studies of laser diodes operating in the same state.

The present invention can be employed to particular advantage in what are called monomodal lasers, the internal resonators of which normally generate light of a single wavelength. Monomodal lasers usually exhibit abrupt mode hopping at specific points when the current strength changes. The laser's activity, in other words, jumps from one mode to an adjacent mode. It was discovered in accordance with the present invention that intentionally inducing a coherence collapse can keep the light output in the low-frequency range much more constant than is possible in monomodal operation. The emitted light will also be much less sensitive to undesired reflection from other components of the optical equipment.

Mode hopping can be classified as internal or external. The internal mode hopping in monomodal lasers is affected by the laser's internal design. In distributed Bragg reflectors (DBR's) for example, internal mode hopping is caused by the structure of the internal resonator. The index of refraction of the laser-active semiconductor material varies not only with the temperature of the diode but with current strength. When these parameters exceed a specified threshold, the resonance frequency will change powerfully enough to generate mode hopping. These discrepancies occur at a very high frequency range, typically of some hundred GHz. The amplification curve of the internal resonator in such a laser diode, its amplification as a function of wavelength, that is, will shift with the diode's temperature. This effect contributes significantly to mode hopping in monomodal lasers.

External mode hopping is dictated by effects outside the diode's internal resonator. These effects can occur for example when a reflecting surface (from a drawing for example) briefly moves into the path of the light inside a laser printer and reflects light back into the diode. In other words, an external resonator is briefly created that affects the laser's overall output and results in mode hopping.

Both aforesaid varieties of mode hopping can be suppressed by the intentional initiation of coherence collapse.

The light can be fed back to the laser diode in accordance with the present invention by either fiber optics or reflection. It is of advantage in attaining incoherent feedback for the optical path of the fed-back light, the external resonator or the feedback path that is, to be essentially longer than the coherence. It is of particular advantage for the optical path to be at least 100 mm long. It is also of advantage to feed at least 0.01% of the diode's light output back into the diode. Feeding 0.1 to 1% of the emitted light back into the diode will definitely produce coherence collapse. A third parameter that governs the effectiveness of the feedback is how much of the fed-back light will cover the diode's effective surface. It has been demonstrated that coherence collapse will be particularly extensive when the cross-section of the reflected beam covers at least 50% of the laser's surface. Such coverage will ensure that the internal feedback factor, the percentage of light intensity fed back to the effective surface, that is, will be between $10^{-5}$ and 1%, resulting in the desired collapse.

For a full understanding of the present invention, reference should now be made to the following detailed description of the preferred embodiments of the invention as illustrated in the accompanying drawings.

DESCRIPTION OF THE PREFERRED EMBODIMENTS

Figure 1:
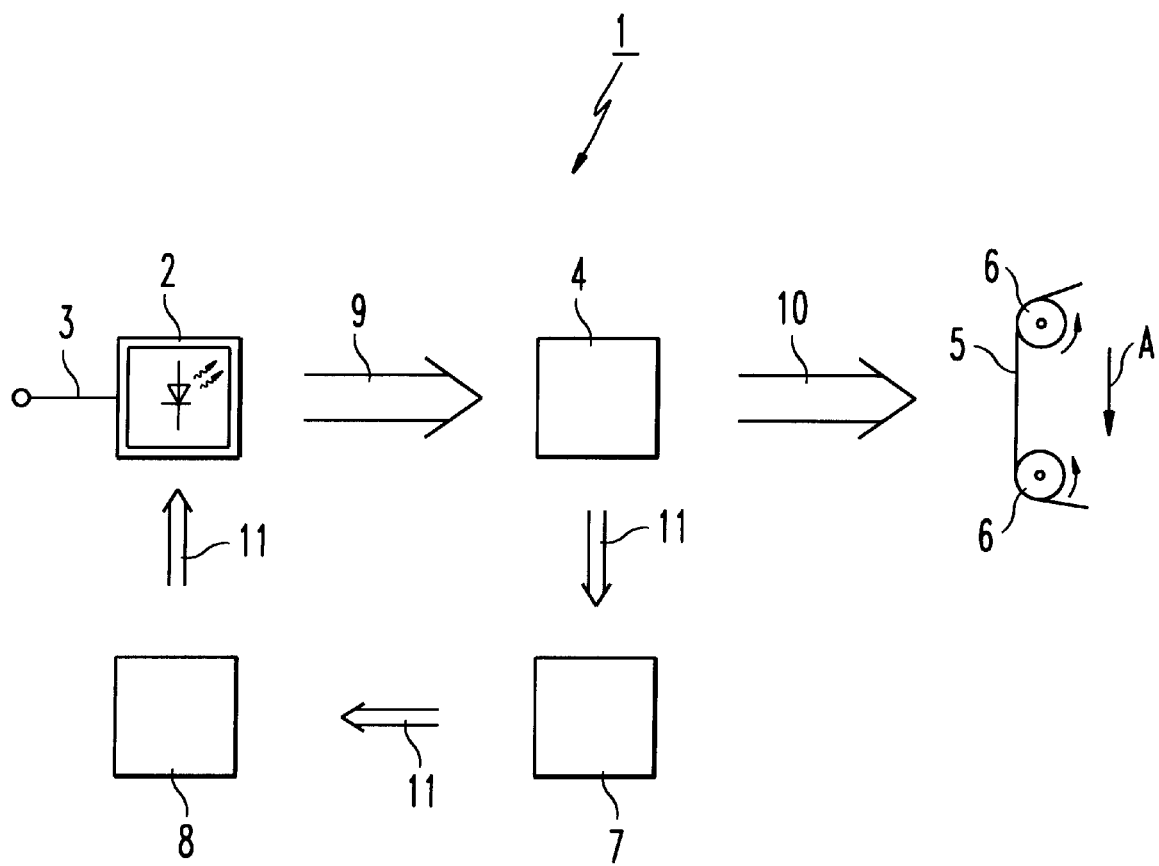
FIG. 1 illustrates the principle of the present invention as employed in a laser printer.

FIG. 1 illustrates how the present invention operates in a laser printer 1 by way of example. A laser diode 2 is activated over a graphic-signal line 3 that provides gray-scale signals. Diode 2 generates a laser beam 9 intensity-modulated with respect to the signal and having a time-modulated output $P_A(t)$. The graphics signals can derive from a CCD scanner or from such a medical-diagnostics device as a CT, NMR, or ultrasound generator. A beam splitter 4 separates original laser beam 9 into a utility beam 10 with an output $P_{nutz}$ and a feedback beam 11 with an output $P_{ruck}$. Utility beam 10 is periodically deflected in an in-itself known procedure by an unillustrated deflector, a polygonal or pivoting mirror for example, to printing stock 5. Stock 5 can for example be a excitable-phosphor coated image-memory film or a photographic film being transported in direction A by rollers 6. Such application require laser diodes of relatively high output, approximately 100 mW or more.

In the embodiment illustrated in FIG. 1, feedback beam 11 is forwarded to an optical input component 8 through an optical feedback component 7. Optical input component 8 directs the beam to the effective surface of laser diode 2. Optical feedback component 7 is for this purpose mounted time-stable and, with respect to diode 2, spatially stable on a support.

FIG. 2 illustrates various versions of the feedback system. The feedback beam 11 in the version illustrated in FIGS. 2*a* and 2*b* travels at least to some extent over the same optical path and through the same optical components as original laser beam 9. The feedback beam 11 in the version illustrated in FIGS. 2*c* and 2*d* travels to the effective surface of laser diode 2 over a separate optical path and through different optical components.

Figure 2A:
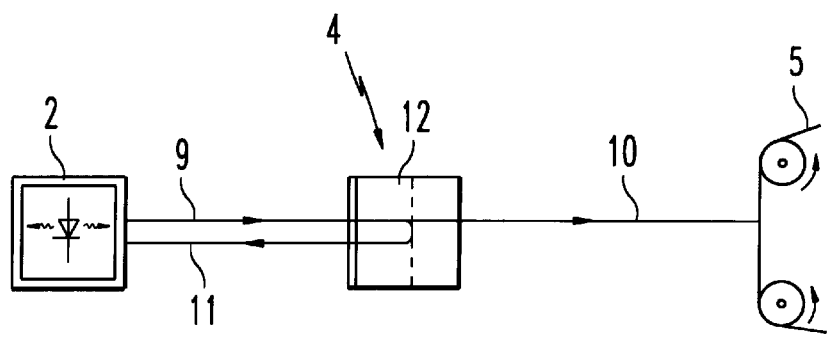
FIG. 2 illustrates various versions of laser-feedback devices.
Figure 2B:
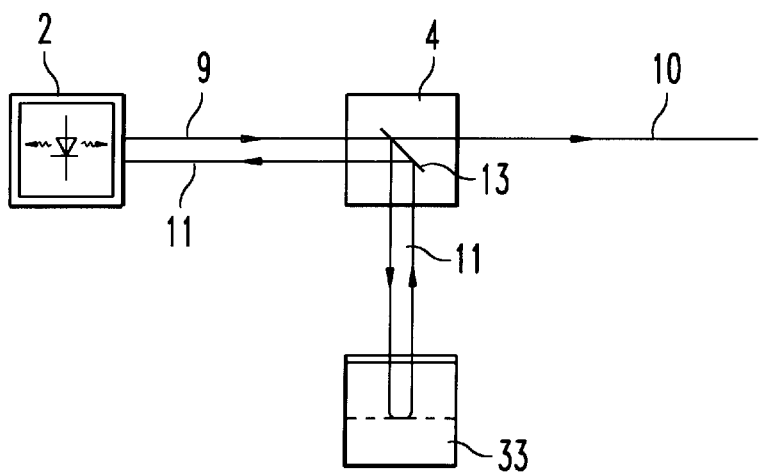
Figure 2C:
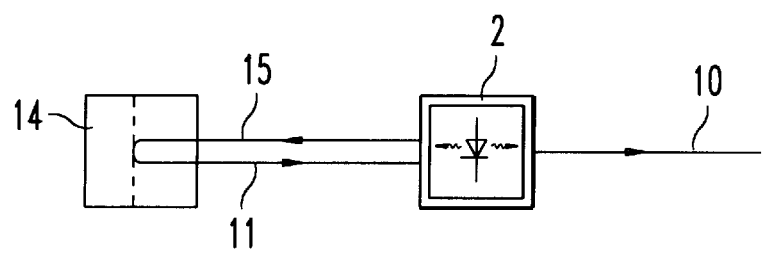
Figure 2D:
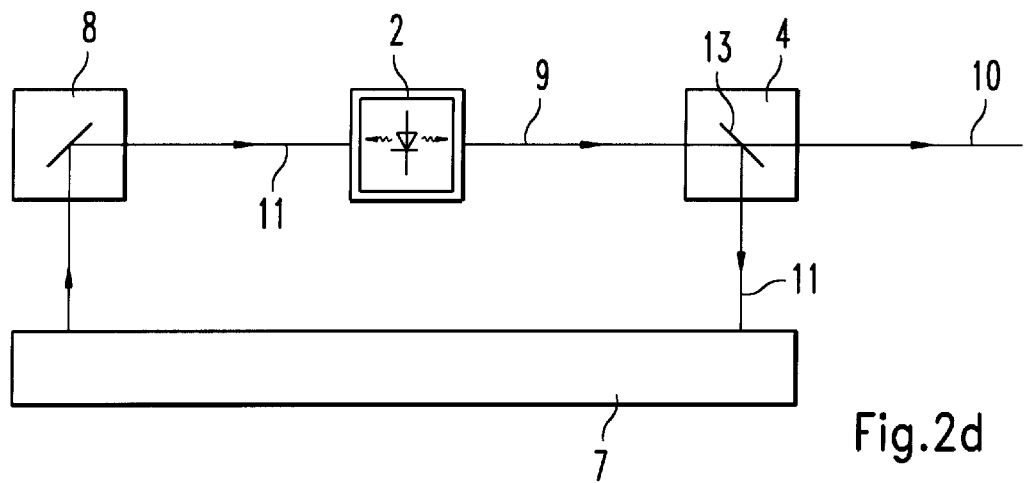

The beam splitters 4 in the versions illustrated in FIGS. 2a, 2b, and 2d all include a reflecting component.

The reflecting component illustrated in FIG. 2a is an optical transmitter and reflector 12. It reflects a prescribed portion of the light shining on it from original laser beam 9 such that feedback beam 11 is coaxial with or at least parallel and next to the optical axis of the original beam.

Part of the feedback beam 11 in the version illustrated in FIG. 2b is deflected by a semitransparent mirror 13 positioned at an angle to the optical axis to a fully reflecting mirror 33. Fully reflecting mirror 33 reflects beam 11 back coaxial with or at least parallel and next to the optical axis. The optical path of feedback beam 11, and hence the laser's overall external resonator, is accordingly considerably longer than that of the embodiment illustrated in FIG. 2.

In the version illustrated in FIG. 2c, light is subtracted from the internal resonator in laser diode 2 both upstream and downstream, by a mirror at each end, that is. The entire beam 10 leaving the internal resonator downstream is employed for the intended application (e.g. to print an image). The beam 15 leaving the internal resonator upstream on the other hand is entirely reflected in the form of a feedback beam 11 by a totally reflecting mirror 14 to the effective surface of diode 2. Both resonator mirror in this version must have a reflection coefficient of less than 1.

The external resonator in this version is as long as the optical path between the upstream-reflecting mirror in laser diode 2 and totally reflecting mirror 14.

FIG. 2d illustrates still another appropriate feedback system. In this version as well, only one laser beam 9 leaves laser diode 2. Laser beam 9 is separated into a utility beam 10 and a feedback beam 11 by the semitransparent mirror 13 in beam splitter 4. Feedback beam 11 is directed into an optical feedback component 7. Optical feedback component 7 can include both deflectors and reflectors or fiber-optical devices. Optical feedback component 7 transmits feedback beam 11 to optical input component 8, a series of lenses for example. The lenses focus feedback beam 11 onto the upstream mirror of the resonator in diode 2 and returns the beam the diode's effective surface.

FIG. 3 provides details of a beam feedback system appropriate for generating coherence collapse inside laser diode 2. Diode 2 is mounted on a support 17 (heat sink) in a module 16. The laser beam 9 generated in diode 2 leaves it divergent through a window in module 16. Laser beam 9 is then shaped into a parallel beam by a collimating lens 18. The focal point of lens 18 is located precisely at the deflection mirror of the laser diode's internal resonator. The lens's focal length is $f_1$. Parallel laser beam 9 shines on a semitransparent plane mirror 19. The front 20 of plane mirror 19 is dielectrically coated to reflect between 1 and 20% and preferably 5% of the beam straight back. The reflected component constitutes a feedback beam 11. The back 21 of mirror 19 transmits all the wavelengths characteristic of diode 2, all the modal wavelengths it can emit, that is. The parallel beam 10 leaving plane mirror 19 is refocused by another lens 22. At the focal point of lens 22 is the stock (e.g. Film) that the image is to be printed on. The stock is located in a plane 24 tilted at an angle α to a plane perpendicular to optical axis B, preventing the stock from reflecting too much light back to the effective surface of diode 2 along the optical axis. Such random reflections have turned out to be especially detrimental to the quality of reproduction. The present invention on the other hand ensures intentional and controlled reflection of specific wavelengths onto the diode's effective surface.

Figure 3A:
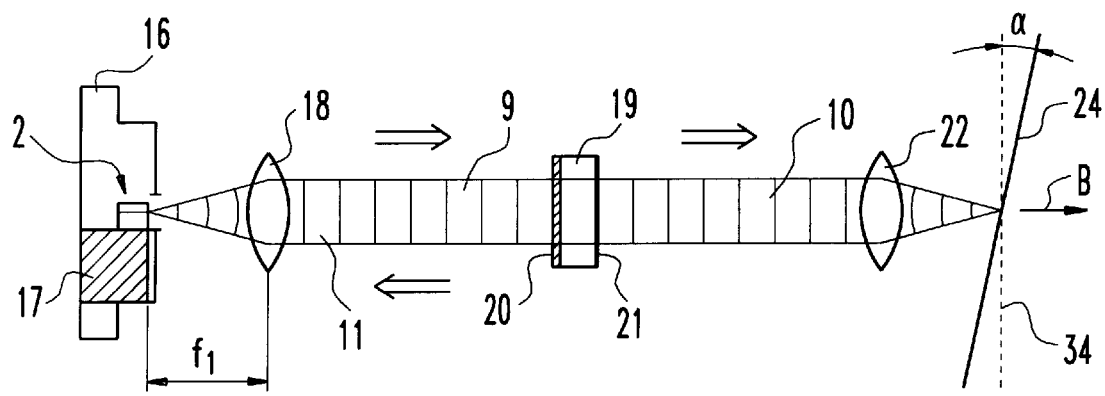
FIG. 3 shows details of laser-feedback devices.
Figure 3B:
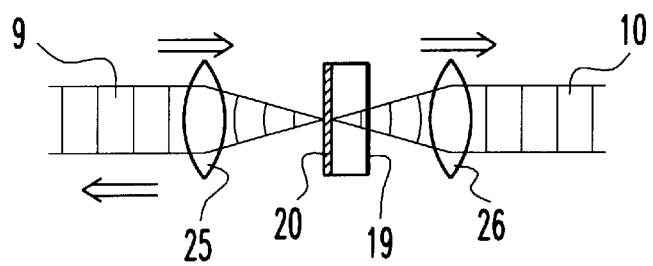

FIG. 3b illustrates a focusing system that can be incorporated into the version illustrated in FIG. 3a instead of the afocal system in the vicinity of plane mirror 19. This system features a focusing lens 25 upstream and another focusing lens 26 downstream of mirror 19. The positions and focal lengths of the lenses ensure that they will focus directly on the semitransparent front 20 of mirror 19.

The semitransparent mirror 19 in the version illustrated in FIG. 3a must be precisely perpendicular to optical axis B to ensure satisfactory feedback of beam 11 to the effective surface of laser diode 2. The relation of the semitransparent mirror to that axis in the version illustrated in FIG. 3b on the other hand is not as critical. The focal relations between lenses 25 and 26 and the front 20 of mirror 19 ensure that the feedback beam 11 will extend precisely along optical axis B even when mirror 19 is not precisely perpendicular to that axis.

Figures 3C, 3D:
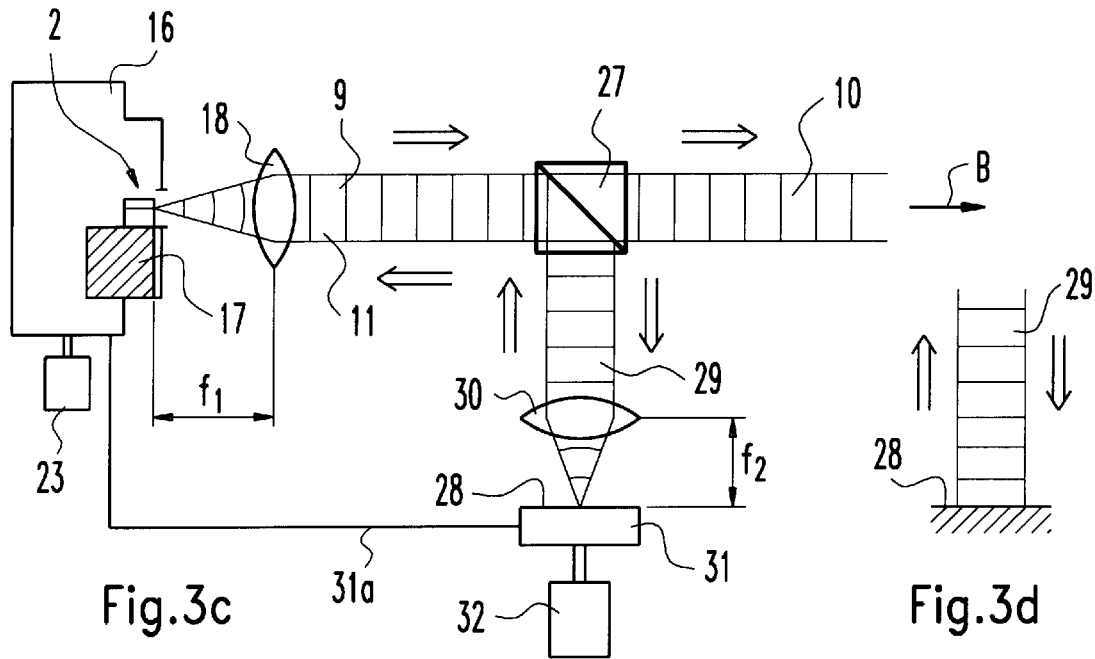

FIG. 3c illustrates another improved version of laser-diode feedback system. A cubical beam splitter 27 diverts approximately 10% of the beam 9 leaving diode 2 into a diverted beam 29 and allows the other 90% through to the stock in the form of a utility beam 10. Diverted beam 29 shines onto a plane surface 28, which can constitute either an opaque mirror or the semitransparent incident surface of a photodiode 31. If surface 28 is an opaque mirror, diverted beam 29 will be entirely fed back to the effective surface of diode 2. If surface 28 is semitransparent on the other hand, the light that enters photodiode 31 can be exploited to regulate any optical fluctuations in diode 2 by way of an appropriate signal-feedback line 31a with associated controls. Another advantage of this version is that the signal from photodiode 31 can be exploited to detect low-frequency noise suppression or coherence collapse. The same signal can then be exploited to advantage to adjust the overall system for example even during the illumination of an operation surface to control the diode itself.

The separated unfocused beam 29 is focused onto surface 28 by a condensing lens 30. It has been discovered important in this version for surface 28 to be precisely at the focal point of condensing lens 30 at focal length $f_2$.

The diverted beam 29 can be fed back very precisely to diode 2 in the form of a feedback beam 11 in this version as well.

The laser diode 2 in this version can be very precisely positioned at the focal point of collimating lens 18 because module 16 is mounted on a base 23 that can be displaced both along optical axis B and above and below it.

Photodiode 31 is also mounted on a base 32 that can be displaced in the x, y, and z directions in relation to lens 30. One version that is simpler than the version illustrated in FIG. 3c entirely lacks a condensing lens 30, and diverted beam 29 is reflected directly back by a reflecting surface 28 perpendicular to its path.

Displaceable bases 23 and 32 can be provided with stepped motors or piezo-electric actuators. Their position can be varied by known controls such that surface 28 and that of diode 2 will be directly at the focal point of their particular adjacent lens.

Figure 4:
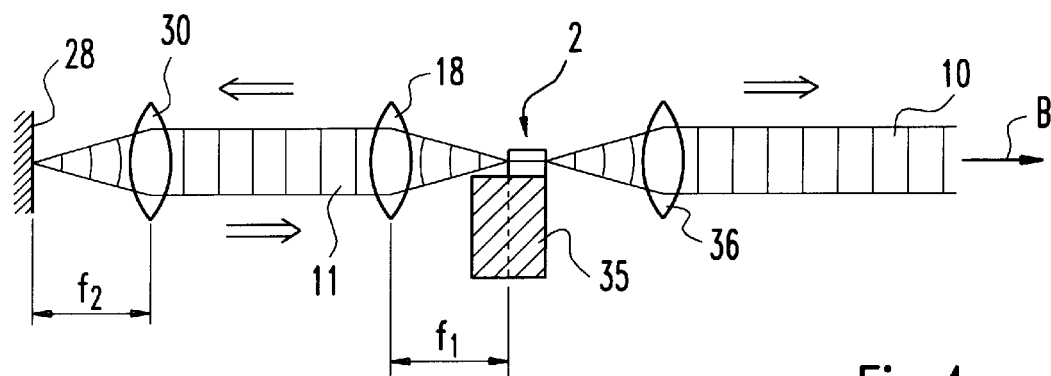
FIG. 4 illustrates a double-sided laser.

FIG. 4 is a detail illustrating a laser diode 2 mounted on a base 35 such that the diode can emit light from each end of its optical resonator. In this chip-on-base system, utility beam 10 is diverted along optical axis B at one end of the diode's resonator and feedback beam 11 at the other end. Collimating lens 18 unfocuses feedback beam 11, and condensing lens 30 focuses it on surface 28, precisely at the end of focal length $f_2$. Surface 28 subsequently directs feedback beam 11 to the effective surface of diode 2, generating coherence collapse. In this system as well it is necessary for the effective surface of or the deflecting mirror in diode 2 to be directly at the end of the focal length $f_1$ of collimating lens 18. Another lens 36 collimates utility beam 10, making it available for its intended purpose, printing an image on a film for example.

Figure 5:
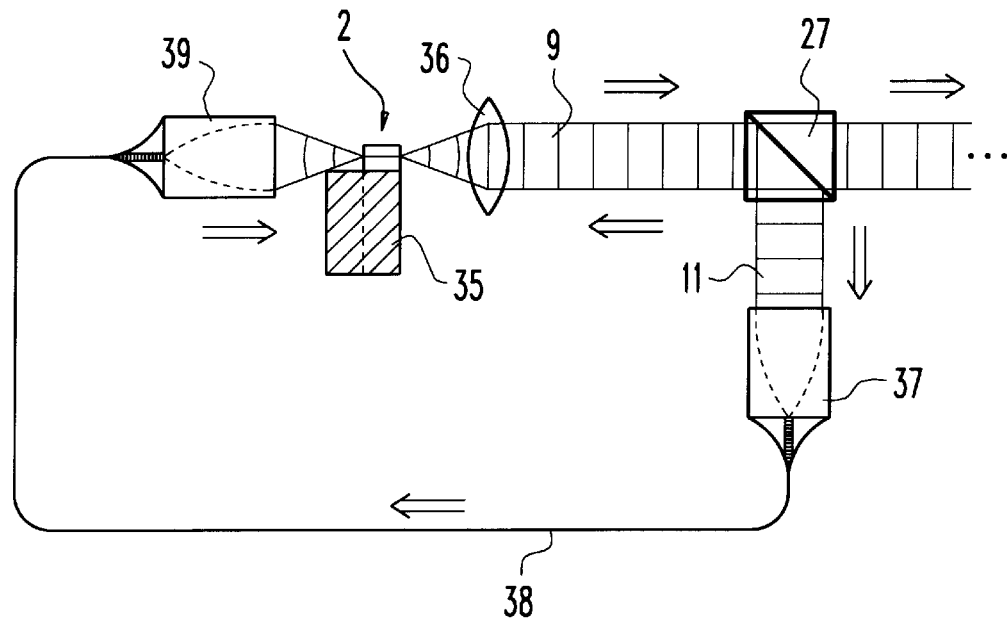
FIG. 5 illustrates a feedback system employing light waveguides.

FIG. 5 illustrates another chip-on-base system wherein feedback beam 11 is separated from the beam 9 leaving laser diode 2 by a cubical beam splitter 27. Feedback beam 11 is introduced into a fiber-optical light guide 38 by a gradient-index rod (GRINROD) 37. Light guide 38 forwards the light through another GRINROD 39 to the upstream surface of diode 2 and to its effective surface.

Figure 6:
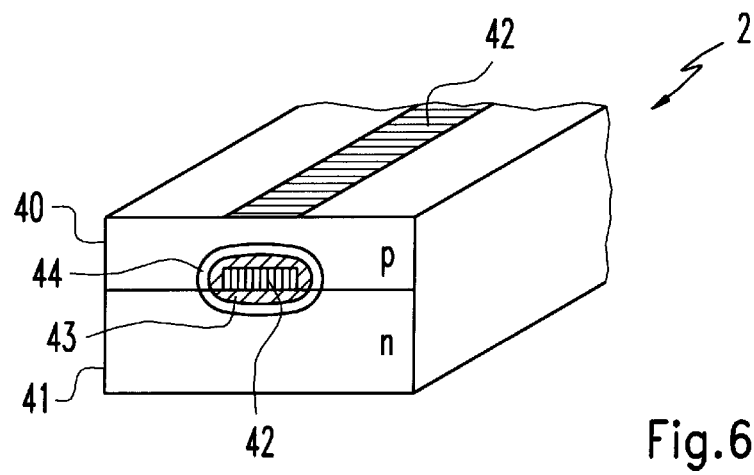
FIG. 6 shows details of a laser diode.

FIG. 6 illustrates the essential components of laser diode 2. The diode comprises a doped-on positive semiconductor layer 40 and a doped-on negative n semiconductor layer 41. The laser's activity occurs in an effective surface 42 at the interface between layers 40 and 41. At least one of the terminal surfaces of the crystal has a reflectivity of less than 100%, allowing light to be diverted outside from effective surface 42. The result is a deflection-dictated light-emitting surface 43 at the laser mirror. The light emitted from effective surface 42 is fed back to it in accordance with the present invention. Feedback is preferably achieved through one of the two laser mirror. To ensure total coherence collapse, the cross-section (44) of the fed-back light beam must overlap as much of the cross-section (43) of the emitted-light beam as possible. An overlap of 50 to 100% has been proven effective.

Figure 7A:
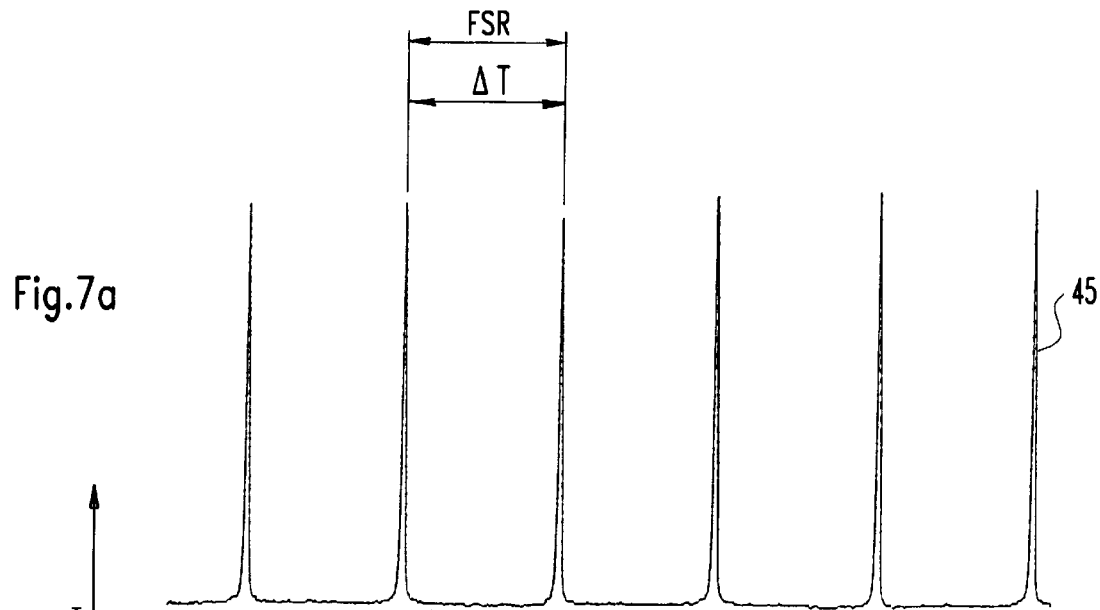
FIG. 7 comprises graphs of various mode spectra.
Figure 7B:
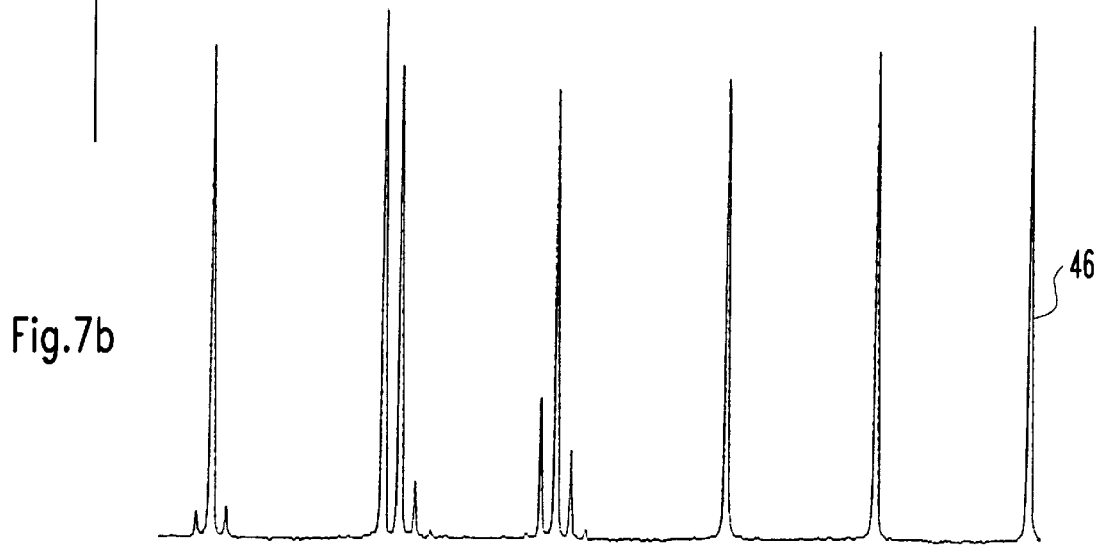
Figure 7C:
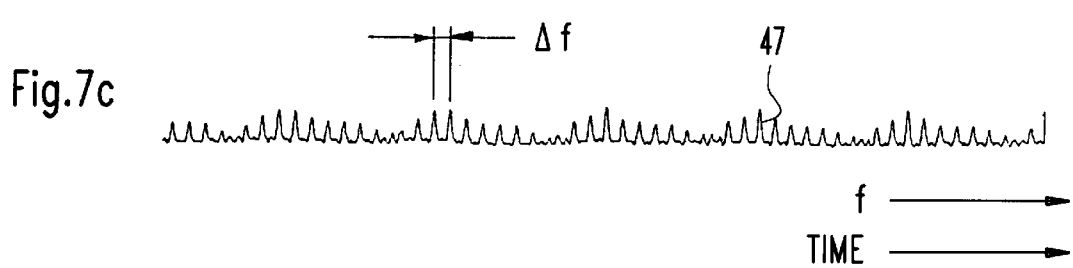

FIG. 7 illustrates the result of laboratory tests of the present invention. FIGS. 7a, 7b, and 7c show spectra 45, 46, and 47 measured by optical analysis (with a Fabry-Perot interferometer) of a free spectral range (FSR) of 4.95 GHz. These spectra derive from a distributed Bragg-reflection (DBR) monomodal laser diode. The feedback is of the nature illustrated in FIG. 3c. Spectra 45 and 46 were produced by positioning the surface 28 illustrated in FIG. 3 20 and 10 □μm away form the precise focal point of condensing lens 30.

The spectrometer was positioned where a film would normally be positioned. As will be evident from spectrum 45, the laser diode 2 in this system has generated just one mode. The interferometer was jiggled in this test over approximately five free spectral ranges. The monomodal spectral line representing the DBT laser is accordingly indicated five time at time intervals ΔT of approximately 8 msec. As surface 28 approaches the precise focal point of condensing lens 30, spectrum 45 merges into spectrum 46, and it will be obvious that the laser has begun activity in three different resonance modes.

Once surface 28 arrived precisely at the end of the focal length $f_2$ of condensing lens 30, the laser activity changed to multimodal, with a difference Δf in frequency of 525 MHz between the various modes. In this spectrum 47 accordingly, the laser's output has been distributed over several different modes.

Figure 8A:
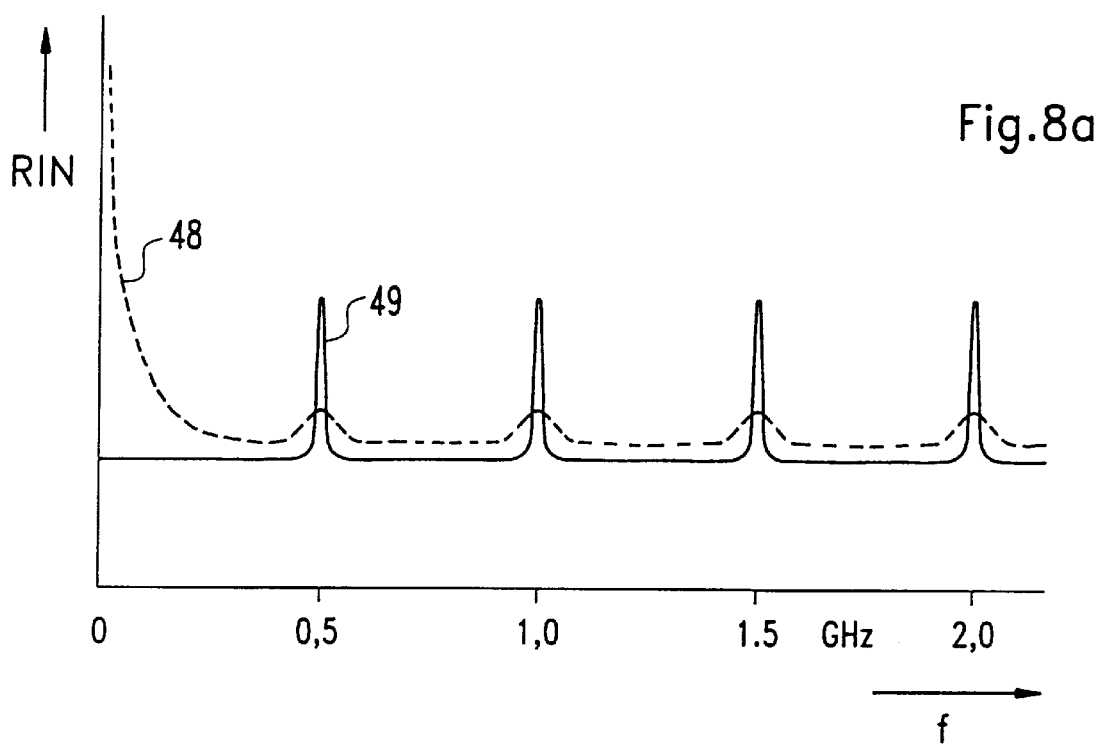
FIG. 8 comprises graphs of two noise spectra.

FIG. 8 illustrates the results of various modal spectra. FIG. 8a schematically shows two noise spectra over a frequency f. They were obtained with the system illustrated in FIG. 3c with a reflecting surface 28 in the form of a photodiode. Spectrum 48 represents the signal-to-noise ratio (relative-intensity noise, RIN) that accompanies mode hopping. Spectrum 49 represents the RIN at coherence collapse. It will be evident that the signal-to-noise ratio is very low and constant at low frequencies, of less than 0.5 GHz, that is. This ensures very constant image quality with a low pixel frequency of less than 0.5 Ghz.

Figure 8B:
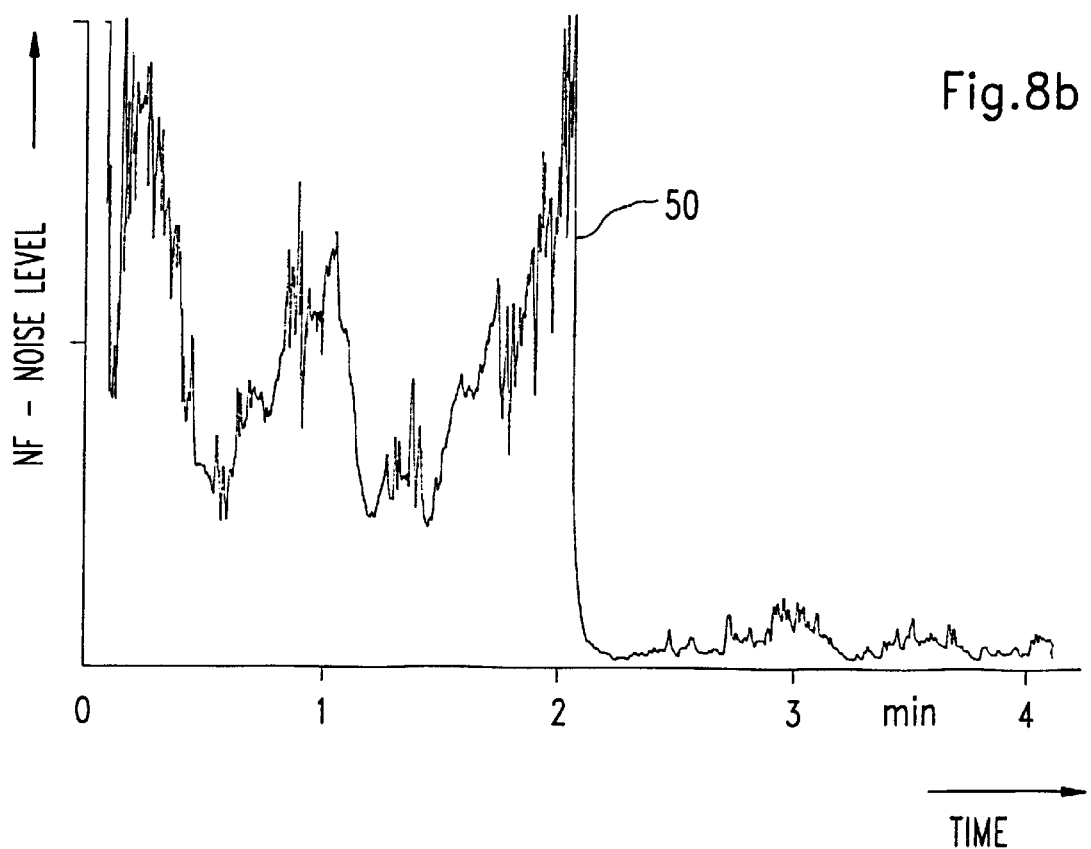

FIG. 8b shows the empirical low-frequency noise level 50 in the 0–10 MHz range as a function of time. Coherence collapse occurs in approximately 2 minutes, with the noise level dropping rapidly by more than 25 dB. This result confirms the stabilizing effect of coherence collapse.

Coherence collapse can also be employed to stabilize diode outputs in a system wherein a laser diode is operated extensively statically but can be switched back and forth between two different outputs. Such a system is employed for example in medicine to excite stimulable phosphor-coated films that carry a latent x-ray image, generating a laser beam point by point that allows the image to be read.

Various examples of how a laser diode can be operated in accordance with the present invention in coherence collapse have been specified. It will accordingly be evident that various variations can occur to one of skill in the art. Complete fiber-optical separation can be provided inside a laser-diode module instead of the external fiber-optical system specified herein. In such systems a focusing lens would be unnecessary, and the feedback could be achieved by simple reflection at the cable faces. Combining the individual features of the various embodiments specified herein is also absolutely possible. It is also absolutely possible to combine the various methods and devices specified herein with state-of-the-art methods and devices to stabilize laser diodes against mode hopping.

It has been demonstrated that the system specified herein can be employed in conjunction with the method specified in German Patent Application 19 607 880.6, which patents have also been applied for worldwide (e.g in Japan and the U.S.A.). The contents of these applications are accordingly hereby incorporated by reference into the present specification. Operating the laser diode with both a noise signal and an adjustment-or-modulating signal is in particular specified therein. Since the noise signal is not a determinate signal but a random broad-band signal, a number of modes is generated inside the diode. The result is that the overall laser energy is uniformly distributed over several different modes, leading to an essentially lower tendency on the part of the diode's output to fluctuate suddenly and irregularly due to mode hopping. It is in this application of advantage for the noise signal to have the widest possible band in the range of 1 to approximately 100 MHz.

The laser diode in the system specified in the German Application No. 19 607 880.6 is in particular actuated not only by an intensity-adjustment signal but by a wide-band bandpass noise signal. The spectrum for this non-periodic incidental signal is continuous, with all frequencies occurring at the same amplitude from a lower threshold $f_u$ to an upper threshold $f_o$. The spectrum of the noise-modulated laser beam accordingly exhibits continuous sidebands wherein all frequencies are uniformly represented. The continuous spectral distribution of the also occasions sideband frequencies that math the resonance frequencies of a parasitic external resonator. The active laser diode will accordingly amplify the energy available at the external-resonator frequencies until unattenuated laser fluctuations occur. Such noise modulation also makes it possible to distribute the output of the diode to a large number of external-resonator modes. Mode hopping and its associated abrupt changes in output will accordingly be extensively suppressed.

Frequency-selective superimposition circuitry is employed to superimpose the noise signal over the adjustment or modulating signal. It acts like a low-pass filter with respect to the utility signal and as a high-pass filter in terms of the noise signal. This circuitry constructs, preferably additively, the combined signal that engages the laser diode.

Figure 9:
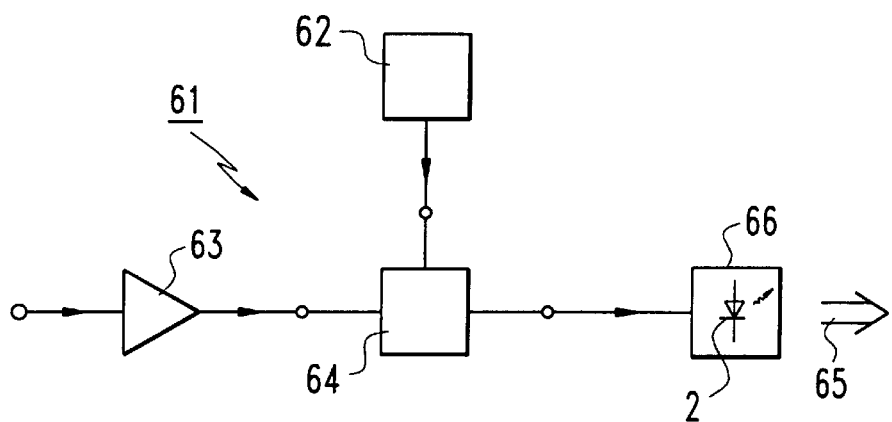
FIG. 9 illustrates a circuit for noise modulating a laser diode.

FIG. 9 illustrates one way to additively superimpose a noise signal over an intensity-adjustment (modulation-imaging or static-adjustment) signal in the electronic controls 61 employed with the laser module 16 illustrated in FIG. 2 or 3. Imaging or adjustment signals arriving at an imaging-signal amplifier 63 are forwarded to a frequency-selective superimposition circuit 64. Circuit 64 superimposes a noise signal generated by a noise generator 62 over the imaging signal. Superimposition circuit 64 accordingly prevents mutual interference by the signal generators. The combined signal is then forwarded to the laser diode 2 in a module 66, which produces a laser beam 65.

With the diode in the static state, the difference between the optical amplification created by the lasering material and the optical losses experienced by the laser's resonator, the gain difference, that is, is zero. During high-frequency disturbance, whereby the frequency spectrum is on the same order of magnitude as that of the laser's inherent resonance, gain difference will vary over time. The effective level of this time-related fluctuation, the dynamic gain difference, is a measure of the actuation of further internal and external diode modes.

Figure 10:
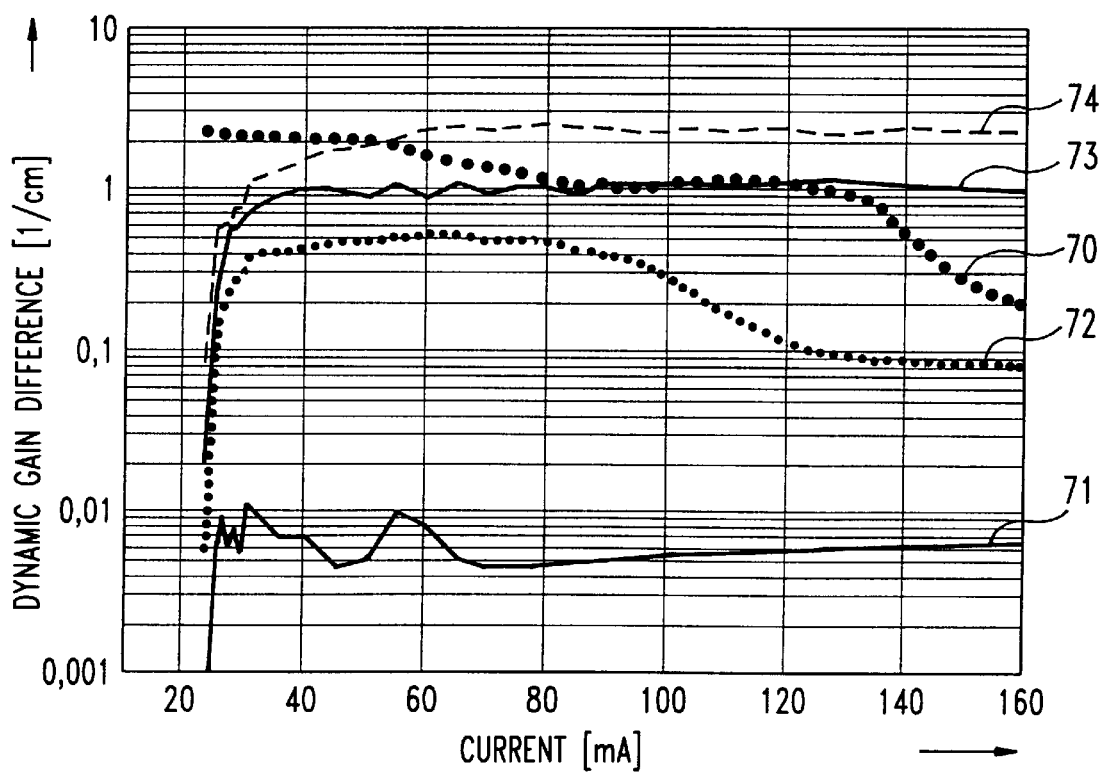
FIG. 10 is a graph comparing the results of coherence collapse with those of noise modulation.

FIG. 10 illustrates dynamic gain difference $\Delta g$ as a function of the current flowing through a laser diode. Dynamic gain difference is influenced by the strength of the optical feedback and by the effective level of any external noise signal. If mode hopping is to be effectively suppressed, $$\Delta g > 0.01 \text{ cm}^{-1}$$

must hold for external, and $$\Delta g > 1.0 \text{ cm}^{-1}$$

for specifically mode hopping.

These curves can be calculated theoretically in a model and experimentally confirmed. Curve 70 results from wide-band noise modulation. Curves 71, 72, 73, and 74 derive from optical feedback in the laser diode, whereby curve 71 is based on an internal-feedback factor of $2 \cdot 10^{-7}$, curve 72 on a factor of $2 \cdot 10^{-5}$ curve 73 on one of $2 \cdot 10^{-4}$, and curve 74 on one of $2 \cdot 10^{-3}$.

It will be evident that noise modulation will suppress more effectively at less powerful currents, at lower light intensities, that is, than a powerful optical feedback (coherence collapse) will. At more powerful currents, however, at higher light intensities, a sufficiently powerful optical feedback is more effective than noise modulation.

The method of noise modulation specified in German 91 607 880.6 does not need special harmonizing measures to ensure optimal mode-hopping suppression. This is also true in the presence of several external resonators with different types of mode hopping as long as the particular resonance frequencies are within the band width of the optical spectrum. Furthermore, superimposing the noise signal over the adjustment signal increases the available light output beyond what can be achieved at the state of the art, which employs scanning.

With semiconductor lasers, the band of the optical spectrum is essentially wider than twice the width of the noise signal because the direct modulation of such component results not only in amplitude modulation but in frequency modulation as well. The band width B of the optical spectrum it establish by the frequency-modulation slope $S_{FM}$ and by the effective level $I_{eff}$ of the noise current:

$$B = S_{FM} \cdot I_{eff}. \quad (B3)$$

This relationship makes it possible to cite a simple requisite for effective suppression of mode hopping by noise modulation. If $L_{ext}$ is the distance between the laser diode and the first optically active surface (point of reflection), a noise current with an effective level of $$I_{eff} > c/(S_{FM} \cdot L_{ext}) \quad (B4)$$

will be of particular advantage. At this distance, all mode hopping provoked by farther-downstream points of reflection will also be suppressed. The FM slope $S_{FM}$ of a laser diode usually ranges from 100 to 500 MHz/mA. At a typical slope of 200 MHz/mA for example, a noise current with an effective level of at least 5 mA will be especially satisfactory for a resonator 30 cm long. Since the effective level of a noise factor is proportional to the root of the product of band width and spectral-output density, both wide-band noise at low densities and narrow-ban noise at higher densities can be employed for noise modulation. This can be experimentally confirmed, with mode hopping suppressed at an effective noise current of approximately 5 mA independently of noise band width (5 and 50 MHz).

Combining the initially described method using coherence collapse with the finally described method using noise modulation results in a decisive advantage for applications in the fields of image scanning, image transmission, and image printing. The overall result is uniformly satisfactory suppression of mode hopping over the total usable range of laser-diode outputs.

There has thus been shown and described a novel method of and device for operating a laser diode which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. In a method of operating a laser diode, whereby the intensity of the laser beam is modulated with an adjustment signal and directed along a path to stock that is to be illuminated and whereby unstable reflections from the stock, acting as a reflector, that disrupt the diode with respect to time and/or space act on the diode, the improvement wherein a component that produces intentional and controlled feedback feeds enough of the light emitted by the diode back to the diode's effective surface along another path to maintain the diode in a state of coherence collapse.

2. Method as defined in claim 1, wherein the feedback is accomplished by fiber-optical means.

3. Method as defined in claim 1, wherein the feedback is accomplished by reflecting optical means.

4. Method defined as in claim 1, wherein the beam is separated into a utility beam and a beam that is fed back to the laser diode.

5. Method as defined in claim 4, wherein the feedback beam is generated by reflecting the light emitted from the laser diode back into the diode from a reflective surface at least to some extent along the path traveled by the emitted light.

6. Method as defined in claim 4, wherein at least one of the laser beam and the feedback beam is focused onto an at least partly semitransparent reflective surface.

7. Method as defined in claim 1, wherein at least one of the laser beam and the feedback beam is at least to some extent reflected back into itself collimated.

8. Method as defined in claim 1, wherein at least 1% of the light emitted by the laser diode is fed back.

9. Method as defined in claim 1, wherein the optical path of the fed-back light is at least 100 mm long outside the effective surface of the laser diode.

10. Method as defined in claim 1, wherein the fed-back light is provided to the effective surface of the diode such that the cross-section of the fed-back light beam overlaps at least 50% of the cross-section of the emitted-light beam.

11. Method as defined in claim 1, wherein the adjustment signal is a modulating signal and modulates the brightness of the laser diode.

12. Method as defined in claim 1, wherein the modulated light either the prints or scans an image, especially on photographic or excitable-phosphor coated image-memory film.

13. In a device for operating a laser diode, whereby the intensity of the laser beam is modulated in operation with an adjustment signal and directed along a path to stock that is to be illuminated and whereby unstable reflections from the stock, acting as a reflector, that disrupt the diode with respect to time and/or space act on the diode, the improvement comprising means for feeding enough of the light emitted by the diode back to the diode's effective surface along another path to maintain the diode in a state of coherence collapse.

14. Device as defined in claim 13, wherein the feedback means include an optical feedback component.

15. Device as defined in claim 13. wherein the feedback means include an reflecting optical component.

16. Device as defined in claim 13, further comprising means for separating the laser beam into a feedback beam and a utility beam, whereby the feedback beam is fed back to the effective surface of the laser diode.

17. Device as defined in claim 15, further comprising means for focusing either the laser beam or the feedback beam onto the means of reflection.

18. Device as defined in claim 13, further comprising means for displacing the laser diode axially and/or laterally with respect to the optical axis.

19. Device as defined in claim 15, further comprising means for displacing the means of reflection axially and/or laterally with respect to the optical axis.

20. Device as defined in claim 13, further comprising means for transmitting a modulating signal in the form of an adjustment signal.

21. Device as defined in claim 16, wherein the second reflector is a photodiode.

22. Device as defined in claim 16, wherein the second reflector in the second path is at least 100 mm away from the laser diode's emitting window.

23. Device as defined in claim 13 with circuitry for adjusting intensity, especially to modulate a laser beam emitted by a laser diode, further comprising means for generating a noise signal and by means for actuating the diode with a signal that combines the noise signal with the adjustment signal.

* * * * *